(12) United States Patent
Hassan et al.

(10) Patent No.: US 10,997,355 B1
(45) Date of Patent: May 4, 2021

(54) DESIGN-RULE CHECKING FOR CURVILINEAR DEVICE FEATURES

(71) Applicant: GLOBALFOUNDRIES U.S. Inc., Santa Clara, CA (US)

(72) Inventors: Ahmed Hassan, Sunnyvale, CA (US); James Culp, New Paltz, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/669,808

(22) Filed: Oct. 31, 2019

(51) Int. Cl.
| | |
|---|---|
| *G06F 30/394* | (2020.01) |
| *G06F 30/398* | (2020.01) |
| *H01L 23/538* | (2006.01) |
| *G01N 21/95* | (2006.01) |
| *G03F 1/20* | (2012.01) |
| *G03F 1/70* | (2012.01) |
| *H01J 37/317* | (2006.01) |

(52) U.S. Cl.
CPC ....... *G06F 30/398* (2020.01); *G01N 21/9503* (2013.01); *G03F 1/20* (2013.01); *G03F 1/70* (2013.01); *G06F 30/394* (2020.01); *H01J 37/3174* (2013.01); *H01L 23/5383* (2013.01)

(58) Field of Classification Search
CPC .. G06F 30/398; G06F 30/394; H01J 37/3174; G03F 1/20; G03F 1/70; G01N 21/9503; H01L 23/5383
See application file for complete search history.

(56) References Cited

U.S. PATENT DOCUMENTS

| | | | |
|---|---|---|---|
| 7,000,207 B2 | 2/2006 | Gothoskar et al. | |
| 8,683,393 B2* | 3/2014 | Acar | G06F 30/398 |
| | | | 716/52 |
| 9,684,761 B1* | 6/2017 | Lamant | G06F 30/398 |
| 2016/0055289 A1* | 2/2016 | Cao | G06F 30/398 |
| | | | 716/112 |

OTHER PUBLICATIONS

U.S. Appl. No. 16/429,536, filed Jun. 3, 2019, entitled Curvilinear Mask Models.

* cited by examiner

*Primary Examiner* — Nghia M Doan
(74) *Attorney, Agent, or Firm* — Hollman Warnick LLC

(57) ABSTRACT

One illustrative system includes a processor and memory storing instructions that, when executed by the processor, cause the system to receive a device layout including a curvilinear feature, define a plurality of vertices for the curvilinear feature, determine a radius of curvature between a selected vertex in the plurality of vertices and a neighboring vertex in the plurality of vertices, and identify a design rule violation for the curvilinear feature responsive to the radius of curvature being less than a predetermined threshold.

18 Claims, 3 Drawing Sheets

DESIGN-RULE CHECKING FOR CURVILINEAR DEVICE FEATURES

BACKGROUND

Generally, the present disclosure relates to the manufacturing of integrated circuits, and, more particularly, to performing design-rule checking for curvilinear device features, the resulting photomasks, and devices printed using the photomasks.

Photonic circuits are employed in optical computing devices. Optical circuit elements include switches, transistors, resistors, multipliers, isolators, etc. Due to the optical characteristics of silicon photonics components, it can be desirable to design the photonics structures using free form curvilinear shapes rather than orthogonal shapes with only vertical and horizontal edges, as is usually done in traditional CMOS design. Furthermore, in order to maintain the desirable optical characteristics of the waveguides and other devices used in photonic applications, it can be desirable to maintain the curvilinear polygon representations through various steps of data processing between design and mask making. Maintaining curvilinear representations throughout the steps of the tape-out flow is a method to ensure that the final shapes on the mask and silicon closely match the design intent of the photonics designs.

Due to the complexity of modern integrated circuits, in the design of integrated circuits, automated design techniques are typically employed. A physical layout of the integrated circuit is created. The layout may be the basis for the formation of photomasks that may be employed for patterning materials in the manufacturing of the integrated circuit by means of photolithography processes. Layouts are typically subjected to a design-rule checking algorithm to verify that the layout satisfies dimensional and spacing constraints associated with the photolithography processes for forming the structures. However, conventional design-rule checking algorithms typically check dimensions and spacing for features that are typically rectangular, or "Manhattanized." To allow for deign-rule checking on optoelectronic structures, designers are constrained to implement curved interfaces as a series of small rectangular steps. When devices are fabricated in silicon, the stepped surfaces introduce loss and interference in the fabricated optoelectronic devices.

SUMMARY

The present disclosure is directed to various methods for performing design-rule checking for curvilinear device features, the resulting photomasks, and devices printed using the photomasks that may solve or reduce one or more of the problems identified above.

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One illustrative system includes a processor and memory storing instructions that, when executed by the processor, cause the system to receive a device layout including a curvilinear feature, define a plurality of vertices for the curvilinear feature, determine a radius of curvature between a selected vertex in the plurality of vertices and a neighboring vertex in the plurality of vertices, and identify a design rule violation for the curvilinear feature responsive to the radius of curvature being less than a predetermined threshold.

One illustrative method includes receiving a device layout including a curvilinear feature, defining a plurality of vertices for the curvilinear feature, determining a radius of curvature between a selected vertex in the plurality of vertices and a neighboring vertex in the plurality of vertices and identifying a design rule violation for the curvilinear feature responsive to the radius of curvature being less than a predetermined threshold.

Another illustrative method includes receiving a device layout including a curvilinear feature, defining a plurality of vertices for the curvilinear feature, and for each selected vertex of the plurality of vertices, identifying a set of neighboring vertices, determining a radius of curvature between the selected vertex and each neighboring vertex in the set of neighboring vertices and identifying a report of design rule violations for the curvilinear feature identifying any of the radii of curvature less than a predetermined threshold. The method further includes changing the device layout based on the report of design rule violations and fabricating the curvilinear feature on a wafer using a reticle generated based on the changed device layout.

BRIEF DESCRIPTION OF THE DRAWINGS

The disclosure may be understood by reference to the following description taken in conjunction with the accompanying drawings, in which like reference numerals identify like elements, and in which.

Figure 1:
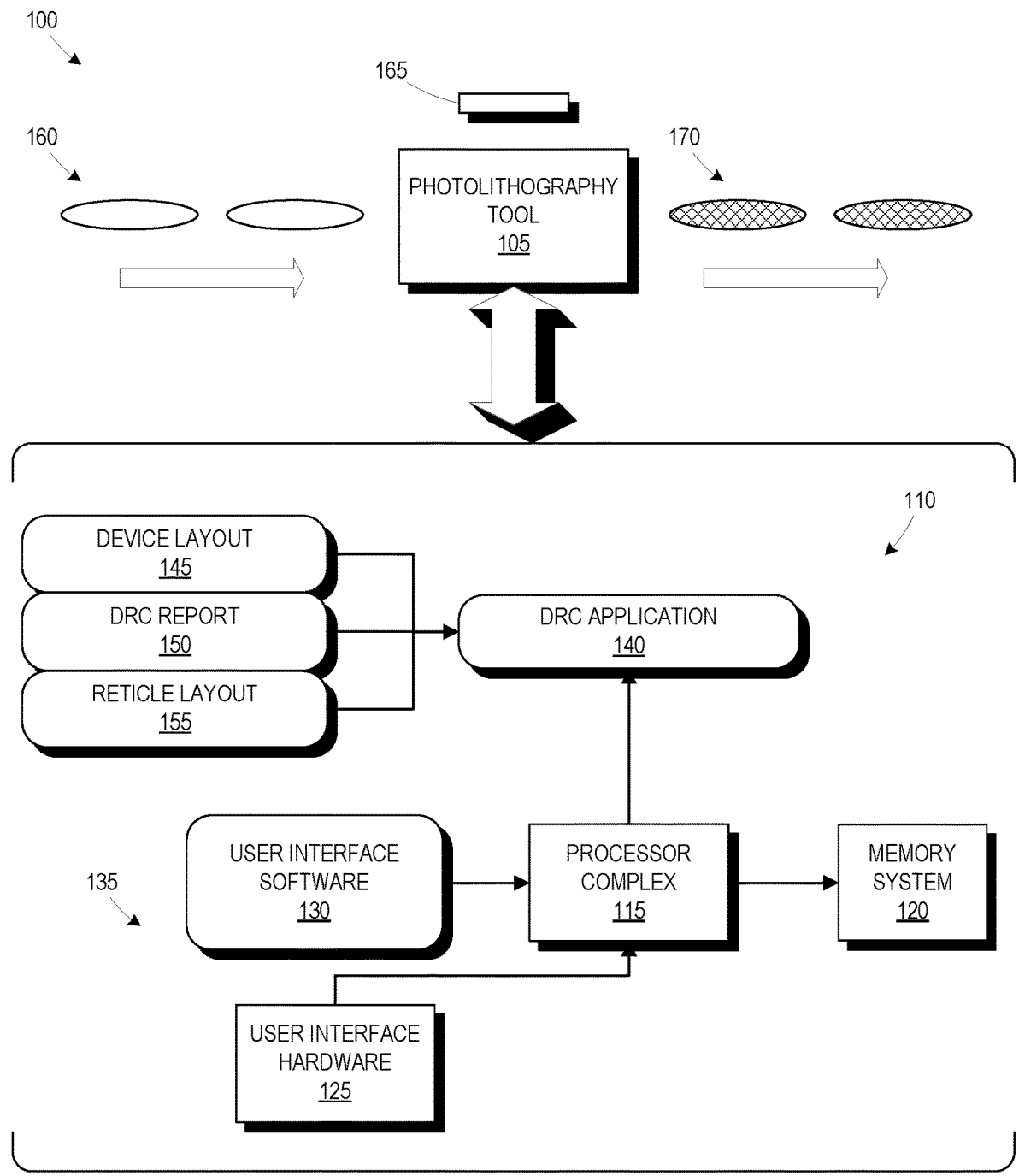
FIG. 1 is a simplified block diagram of a design rule checking system, according to some embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, photonic devices, mixed photonic and integrated circuit devices, etc.

The present disclosure generally relates to semiconductor structures and, more particularly, to curvilinear mask models and methods of manufacture. In some embodiments, the structures and processes described herein enable design rule checking for curvilinear designs for silicon photonics mask applications preserving the free form nature of designs needed for silicon photonics applications.

FIG. 1 is a simplified block diagram of a design rule checking system 100 including a photolithography tool 105 and a computing system 110, according to some embodiments. The computing system 110 may be implemented in virtually any type of electronic computing device, desktop computer, a server, a minicomputer, a mainframe computer, cloud-based virtual machine, or a supercomputer. The present subject matter is not limited by the particular implementation of the computing system 110. The computing system 110 includes a processor complex 115 communicating with a memory system 120. The memory system 120 may include nonvolatile memory (e.g., hard disk, flash memory, etc.), volatile memory (e.g., DRAM, SRAM, etc.), or a combination thereof. The processor complex 115 may be any suitable processor known in the art, and may represent multiple interconnected processors in one or more housings or distributed across multiple networked locations. The computing system 110 may include user interface hardware 125 (e.g., keyboard, mouse, display, etc.), which together, along with associated user interface software 130, comprise a user interface 135. The processor complex 115 executes software instructions stored in the memory system 120 and stores results of the instructions on the memory system 120 to implement a design rule checking (DRC) application 140, as described in greater detail below. The DRC application 140 evaluates a device layout 145 and generates a DRC report 150. A reticle layout 155 is generated based on a final version of the device layout 145.

The photolithography tool 105 performs patterning operations on wafers 160 using a reticle 165 generated based on the reticle layout 155 to fabricate exposed wafers 170. In one embodiment, the photolithography tool 105 includes multiple sub-tools or chambers, that may be arranged in a cluster arrangement. In general, the photolithography tool 105 forms a layer of photoresist over a layer to be patterned. In some embodiments, the photoresist layer is formed over a photolithography stack. The photolithography stack may include a hard mask layer formed over a process layer to be patterned. A bottom anti-reflective coating (BARC) layer may be formed over the hard mask layer (e.g., using a spin coating process). An organic planarization layer (OPL) may be formed over the BARC layer. In some embodiments, the OPL layer is a photo-sensitive organic polymer that is applied using a spin coating process. The photolithography tool forms the photoresist layer over the OPL layer. In general, the photoresist layer is an electromagnetic radiation sensitive material and properties, such as solubility, of the photoresist layer are affected by electromagnetic radiation. The photoresist layer is either a negative photoresist or a positive photoresist. In some embodiments, portions of the OPL layer are also irradiated by the electromagnetic radiation that patterns the photoresist layer to change the etch selectivity of the irradiated portions of the OPL layer with respect to non-irradiated portions. The photolithography tool 105 includes a stepper portion that exposes the photoresist layer using a radiation source and the reticle 165 to define a pattern in the photoresist layer. Portions of the photoresist layer are removed using a developer portion of the photolithography tool to define a patterned photoresist layer. Other tools, such as an etch tool, may be used to transfer the pattern in the photoresist layer to the underlying OPL layer, the BARC layer, and the hard mask layer. The upper layers of the photolithography stack may be removed and the hard mask layer may be used as a template for etching features into the process layer (e.g., silicon) to define photonics devices.

Figure 2:
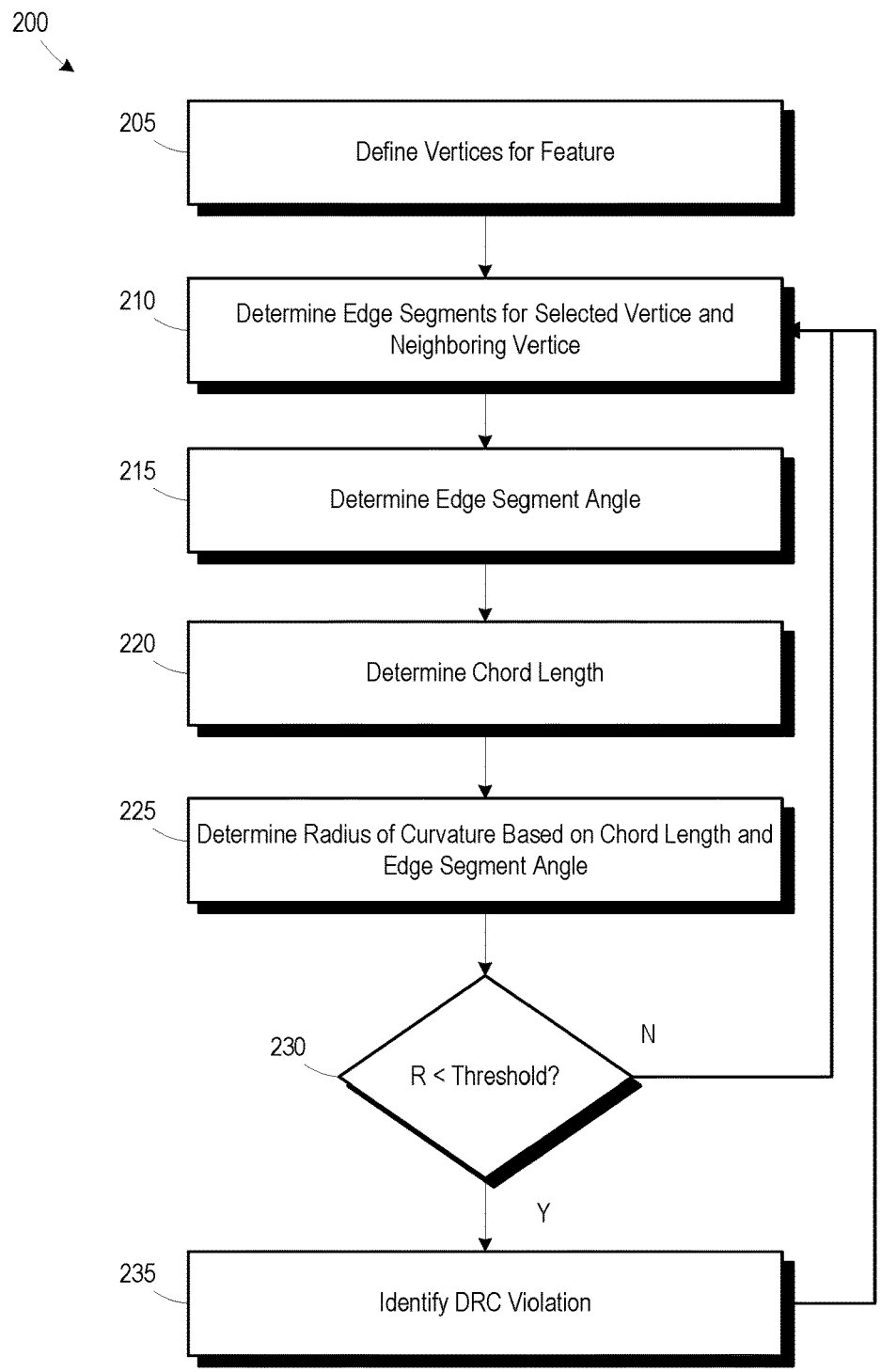
FIG. 2 is a flow diagram illustrating a method for performing design rule checking for curvilinear features, according to some embodiments.

FIG. 2 is a flow diagram illustrating a method 200 for performing design rule checking for curvilinear features, according to some embodiments. In general, the DRC application 140 identifies features in the device layout 145 and performs DRC checking on the features using a radius of curvature approach.

Figure 3:
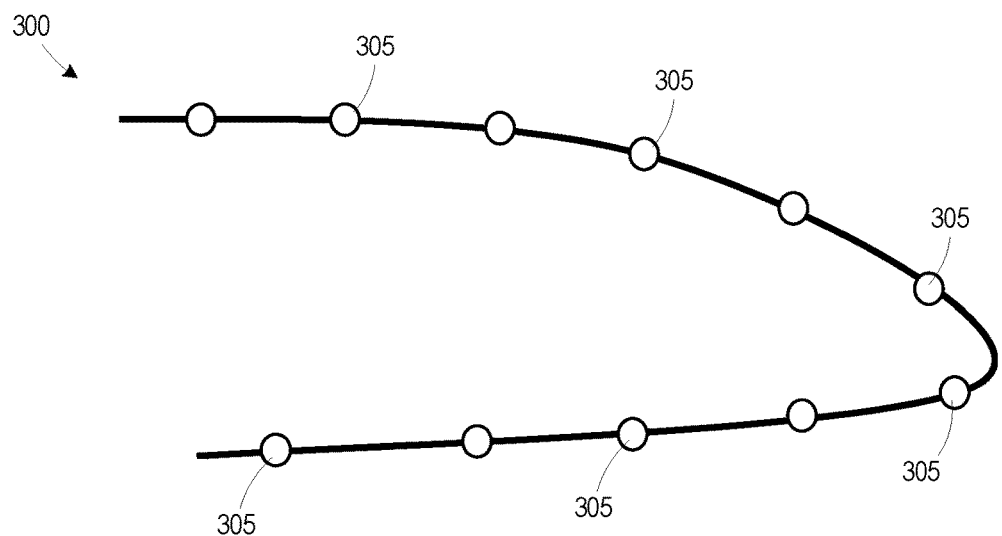
FIG. 3 is a diagram of a portion of a curvilinear feature 300 in the device layout 145, according to some embodiments.

FIG. 3 is a diagram of a portion of a curvilinear feature 300 in the device layout 145, according to some embodiments. The particular shape of the curvilinear feature 300 is provided for example purposes. The device layout 145 may include many features, some rectangular or "Manhattanized" and some curvilinear. The DRC technique described herein may be applied to curvilinear or rectangular features to evaluate radius of curvature violations.

The DRC application 140 defines vertices 305 for the curvilinear feature 300 in method block 205. The spacing between the vertices 305 may vary. In some embodiments, the spacing, s, of the vertices is a function of the minimum critical dimension (CD) of the photolithography tool 105 arising from the finite aperture of the optical system. In some embodiments, the spacing is about 0.7*minCD.

Figure 4:
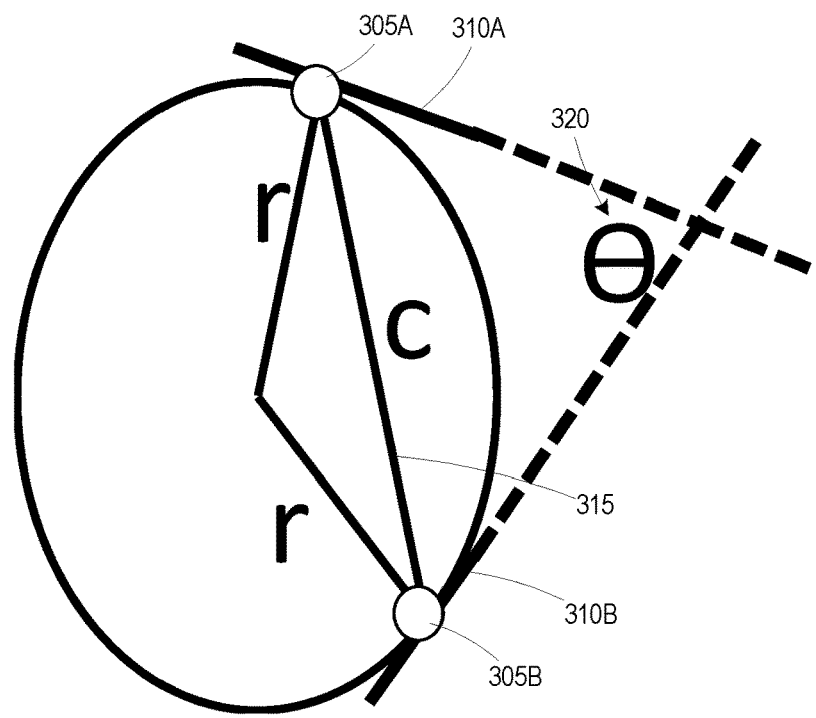
FIG. 4 is a diagram illustrating a selected vertex and a neighboring vertex, according to some embodiments.

FIG. 4 is a diagram illustrating a selected vertex 305A and a neighboring vertex 305B, according to some embodiments. In general, the DRC application 140 determines a radius of curvature between the selected vertex 305A and the neighboring vertex 305B. For example, neighboring vertices may be a set of vertices within a predetermined distance from the selected vertex 305A.

In method block 210, the DRC application 140 defines edge segments 310A, 310B for the selected vertex 305A and the neighboring vertex 305B. The edge segments 310A, 310B are tangent to the curvilinear feature 300 at the respective vertex 305A, 305B.

In method block 215, the DRC application 140 determines an edge segment angle 320 defined where the edge segments 310A, 310B intersect. The edge segment angle 320 may be determined using a dot product calculation:

$$\cos(\theta) = \frac{a \cdot b}{|a| \cdot |b|},$$

where a and b are vectors representing the edge segments 310A, 310B, respectively.

In method block 220, the DRC application 140 determines a length of the chord 315, C, between the selected vertex 305A and the neighboring vertex 305B. The chord length, C, is a straight-line distance between the two vertices 305A, 305B.

In method block 225, the radius of curvature is determined for the selected vertex 305A and the neighboring vertex 305B by:

$$R = \frac{C}{2 \cdot \cos\left(\frac{\theta}{2}\right)}.$$

In method block 230, the DRC application 140 determines if the radius of curvature is less than a predetermined threshold. If the radius of curvature is less than the predetermined threshold, the DRC application 140 identifies a DRC violation in method block 235. In some embodiments, the radius of curvature threshold is minCD. After identifying the DRC violation in method block 235, or if the radius of curvature is not less than the predetermined threshold in method block 230, the DRC application 140 returns to method block 210 to analyze the next neighboring vertex associated with the selected vertex 305A. The DRC application 140 repeats the radius of curvature determination for all vertices 305 and their neighbors.

Note that the $$\cos\left(\frac{\theta}{2}\right)$$

term in the radius of curvature equation approaches zero as the edge segments approach a perpendicular orientation (e.g., right corner) resulting in an undefined state. Using a spacing of about 0.7*minCD allows the DRC application 140 to evaluate both curvilinear and rectangular features by staying away from perpendicular edge segments.

Based on the DRC violations identified in method block 235, the DRC application 140 generates the DRC report 150 (see FIG. 1). Designers may employ the DRC report 150 to iteratively alter the device layout 145 until the DRC application 140 reports no DRC violations. The reticle layout 155 may be implemented based on the adjusted device layout 145. The reticle 165 may be fabricated using the reticle layout 155, and the photolithography tool 105 may perform patterning operations on wafers 160 using the reticle 165.

Using a radius of curvature approach for performing DRC checking on curvilinear features improves the design process for generating the device layout 145. Fabricating a reticle 165 using the resulting device layout 145 allows wafers 160 to be fabricated with curvilinear optical features, thereby increasing the performance of the features as compared to a device with Manhattanized optical features.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A system, comprising:
   a processor; and
   memory storing instructions that, when executed by the processor, cause the system to:
      receive a device layout including a curvilinear feature;
      define a plurality of vertices for the curvilinear feature;
      determine a radius of curvature between a selected vertex in the plurality of vertices and a neighboring vertex in the plurality of vertices, wherein the instructions, when executed by the processor, cause the system to determine the radius of curvature by:
         defining a first edge segment for the selected vertex;
         determining a second edge segment for the neighboring vertex;
         determining an angle between the first and second edge segments; and
         determining the radius of curvature based on the angle; and
      identify a design rule violation for the curvilinear feature responsive to the radius of curvature being less than a predetermined threshold,
   wherein the predetermined threshold comprises a minimum critical dimension of a photolithography process for fabricating the curvilinear feature,
   wherein a spacing between the selected vertex and the neighboring vertex is greater than or equal to 0.7 times the minimum critical dimension, and the spacing prevents determining the radius of curvature of a portion of an edge segment having a perpendicular orientation.

2. The system of claim 1, wherein the first edge segment is tangent to the curvilinear feature at the selected vertex, and the second edge segment is tangent to the curvilinear feature at the neighboring vertex.

3. The system of claim 2, wherein the instructions, when executed by the processor, cause the system to determine the radius of curvature by:
   determining a chord length of a chord defined between the selected vertex and the neighboring vertex; and
   determining the radius of curvature based on the angle and the chord length.

4. The system of claim 2, wherein the angle ($\theta$) is calculated using a dot product calculation comprising:

$$\cos(\theta) = \frac{a \cdot b}{|a| \cdot |b|},$$

wherein a and b are vectors representing the first edge segment and the second edge segment, respectively.

5. The system of claim 4, wherein the chord length (C) is a straight-line distance between the selected vertex and the neighboring vertex, and wherein the radius of curvature is defined by:

$$R = \frac{C}{2 \cdot \cos\left(\frac{\theta}{2}\right)}.$$

6. A method, comprising:
receiving a device layout including a curvilinear feature;
defining a plurality of vertices for the curvilinear feature;
determining a radius of curvature between a selected vertex in the plurality of vertices and a neighboring vertex in the plurality of vertices, wherein determining the radius of curvature comprises:
    defining a first edge segment for the selected vertex;
    determining a second edge segment for the neighboring vertex;
    determining an angle between the first and second edge segments; and
    determining the radius of curvature based on the angle; and
identifying a design rule violation for the curvilinear feature responsive to the radius of curvature being less than a predetermined threshold,
wherein the predetermined threshold comprises a minimum critical dimension of a photolithography process for fabricating the curvilinear feature,
wherein a spacing between the selected vertex and the neighboring vertex is greater than or equal to 0.7 times the minimum critical dimension, and the spacing prevents determining the radius of curvature of a portion of an edge segment having a perpendicular orientation.

7. The method of claim 6, further comprising changing the device layout responsive to identifying the design rule violation.

8. The method of claim 7, further comprising fabricating the curvilinear feature on a wafer using a reticle generated based on the changed device layout.

9. The method of claim 6, wherein the first edge segment is tangent to the curvilinear feature at the selected vertex, and the second edge segment is tangent to the curvilinear feature at the neighboring vertex.

10. The method of claim 9, wherein determining the radius of curvature comprises:
    determining a chord length of a chord defined between the selected vertex and the neighboring vertex; and
    determining the radius of curvature based on the angle and the chord length.

11. The method of claim 10, wherein the angle ($\theta$) is calculated using a dot product calculation comprising:

$$\cos(\theta) = \frac{a \cdot b}{|a| \cdot |b|},$$

wherein a and b are vectors representing the first edge segment and the second edge segment, respectively.

12. The method of claim 11, wherein the chord length (C) is a straight-line distance between the selected vertex and the neighboring vertex, and wherein the radius of curvature is defined by:

$$R = \frac{C}{2 \cdot \cos\left(\frac{\theta}{2}\right)}.$$

13. The method of claim 6, further comprising repeating the determining of the radius of curvature and the identification of the design rule violation for each of the plurality of vertices and associated neighboring vertices.

14. A method, comprising:
receiving a device layout including a curvilinear feature;
defining a plurality of vertices for the curvilinear feature;
for each selected vertex of the plurality of vertices:
    identifying a set of neighboring vertices;
    determining a radius of curvature between the selected vertex and each neighboring vertex in the set of neighboring vertices, wherein determining the radius of curvature comprises:
        defining a first edge segment for the selected vertex;
        determining a second edge segment for the neighboring vertex;
        determining an angle between the first and second edge segments; and
        determining the radius of curvature based on the angle; and
identifying a report of design rule violations for the curvilinear feature identifying any of the radii of curvature less than a predetermined threshold,
wherein the predetermined threshold comprises a minimum critical dimension of a photolithography process for fabricating the curvilinear feature,
wherein a spacing between the selected vertex and the neighboring vertex is greater than or equal to 0.7 times the minimum critical dimension, and the spacing prevents determining the radius of curvature of a portion of an edge segment having a perpendicular orientation;
changing the device layout based on the report of design rule violations; and
fabricating the curvilinear feature on a wafer using a reticle generated based on the changed device layout.

15. The method of claim 14, wherein the first edge segment is tangent to the curvilinear feature at the selected vertex, and the second edge segment is tangent to the curvilinear feature at the neighboring vertex.

16. The method of claim 15, wherein determining the radius of curvature comprises:
    determining a chord length of a chord defined between the selected vertex and the neighboring vertex; and
    determining the radius of curvature based on the angle and the chord length.

17. The method of claim 16, wherein the angle ($\theta$) is calculated using a dot product calculation comprising:

$$\cos(\theta) = \frac{a \cdot b}{|a| \cdot |b|},$$

wherein a and b are vectors representing the first edge segment and the second edge segment, respectively.

18. The method of claim 17, wherein the chord length (C) is a straight-line distance between the selected vertex and the neighboring vertex, and wherein the radius of curvature is defined by:

$$R = \frac{C}{2 \cdot \cos\left(\frac{\theta}{2}\right)}.$$

* * * * *